US009647717B2

United States Patent
Xiong et al.

(10) Patent No.: US 9,647,717 B2
(45) Date of Patent: May 9, 2017

(54) DIGITAL PRE-DISTORTION PARAMETER OBTAINING METHOD AND PRE-DISTORTION SYSTEM

(71) Applicant: Datang Mobile Communications Equipment Co., Ltd., Beijing (CN)

(72) Inventors: Jun Xiong, Beijing (CN); Xinmin Wang, Beijing (CN); Tao Duan, Beijing (CN); Jingyi Wang, Beijing (CN)

(73) Assignee: Datang Mobile Communications Equipment Co., Ltd. (CN)

( * ) Notice: Subject to any disclaimer, the term of this patent is extended or adjusted under 35 U.S.C. 154(b) by 0 days.

(21) Appl. No.: 15/108,108

(22) PCT Filed: Dec. 24, 2014

(86) PCT No.: PCT/CN2014/094808
§ 371 (c)(1),
(2) Date: Jun. 24, 2016

(87) PCT Pub. No.: WO2015/096735
PCT Pub. Date: Jul. 2, 2015

(65) Prior Publication Data
US 2016/0329927 A1     Nov. 10, 2016

(30) Foreign Application Priority Data
Dec. 26, 2013   (CN) .......................... 2013 1 0741067

(51) Int. Cl.
*H04B 1/62*     (2006.01)
*H03F 3/24*     (2006.01)
(Continued)

(52) U.S. Cl.
CPC ............. *H04B 1/62* (2013.01); *H03F 1/3247* (2013.01); *H03F 3/24* (2013.01); *H03F 3/245* (2013.01);
(Continued)

(58) Field of Classification Search
CPC ................ H03F 1/3247; H03F 1/3258; H03F 2201/3233; H03F 1/3241; H03F 2200/198;
(Continued)

(56) References Cited

U.S. PATENT DOCUMENTS 6,246,286 B1 *   6/2001   Persson ................. H03F 1/3241
                                                   330/136
7,929,927 B2 *   4/2011   Norris .................. H03F 1/3247
                                                   455/114.2
(Continued)

FOREIGN PATENT DOCUMENTS

| CN | 102413083 A | 4/2012 |
|---|---|---|
| CN | 102511153 A | 6/2012 |
| CN | 103685111 A | 3/2014 |

OTHER PUBLICATIONS

D.R. Morgan et al., "A Generalized Memory Polynomial Model for Digital Predistortion of RF Power Amplifiers," IEEE Transaction on Signal Processing, vol. 54, Issue 10, Oct. 2006, pp. 3852-3860 (English Abstract).
(Continued)

*Primary Examiner* — Janice Tieu
(74) *Attorney, Agent, or Firm* — DLA Piper LLP (US)

(57) ABSTRACT

The present application relates to the field of digital pre-distortion processing. Disclosed in an embodiment of the present application are a pre-distortion parameter obtaining method and pre-distortion system for simplifying calculating complexity of a model while achieving good signal
(Continued)

processing effect. The method comprises: after the beginning of periodic filtering processing, obtaining a pre-distorted signal after pre-distortion processing and a first feedback signal after power amplification (S101); obtaining a second feedback signal by eliminating the rated linear gain of the first feedback signal (S102); determining a pre-distortion parameter according to a matrix formed by the second feedback signal and a matrix formed by the pre-distorted signal (S103); updating the pre-distortion parameter index table according to the determined pre-distortion parameter (104).

12 Claims, 5 Drawing Sheets

(51) Int. Cl.
  H04L 25/49   (2006.01)
  H04B 1/04    (2006.01)
  H04L 27/36   (2006.01)
  H03F 1/32    (2006.01)
(52) U.S. Cl.
  CPC ........... *H04B 1/0475* (2013.01); *H04L 25/49* (2013.01); *H03F 1/3241* (2013.01); *H03F 1/3258* (2013.01); *H03F 2200/198* (2013.01); *H03F 2201/3209* (2013.01); *H03F 2201/3224* (2013.01); *H03F 2201/3227* (2013.01); *H03F 2201/3233* (2013.01); *H04B 1/04* (2013.01); *H04B 2001/0416* (2013.01); *H04B 2001/0425* (2013.01); *H04L 27/367* (2013.01); *H04L 27/368* (2013.01)

(58) Field of Classification Search
  CPC ..... H03F 2201/3224; H03F 2201/3227; H03F 3/245; H03F 2201/3209; H04L 27/368; H04B 2001/0425; H04B 1/0475; H04B 2001/0433; H04B 2001/0416; H04B 1/04; H04B 1/62
  See application file for complete search history.

(56) References Cited

U.S. PATENT DOCUMENTS

| | | | |
|---|---|---|---|
| 2005/0009479 A1* | 1/2005 | Braithwaite | H03F 1/3235 455/114.3 |
| 2007/0216480 A1* | 9/2007 | Benedict | H03F 1/3247 330/149 |
| 2012/0119832 A1* | 5/2012 | Bai | H03F 1/3247 330/149 |
| 2015/0054579 A1* | 2/2015 | Omer | H03F 1/3247 330/149 |

OTHER PUBLICATIONS

Jing-chang Nan et al., "New LMEC model for behavior modeling and predistortion for RF power amplifiers," Application Research of Computers, vol. 30, No. 8, Aug. 2013, pp. 2448-2449, Sections 1-4 (English Abstract).

Nizamuddin, M., et al., "Nonlinear Tapped Delay Line Digital Predistorter for Power Amplifiers with Memory," *Wireless Communications and Networking*, 2003, vol. 1, pp. 607-611.

* cited by examiner

US 9,647,717 B2

DIGITAL PRE-DISTORTION PARAMETER OBTAINING METHOD AND PRE-DISTORTION SYSTEM

This application is a US National Stage of International Application No. PCT/CN2014/094808, filed on 24 Dec. 2014, designating the United States, and claiming the benefit of Chinese Patent Application No. 201310741067.6, filed with the Chinese Patent Office on Dec. 26, 2013 and entitled "Digital pre-distortion parameter obtaining method and pre-distortion system", which is hereby incorporated by reference in its entirety.

FIELD

The present application relates to the field of digital pre-distorting and particularly to a method for obtaining digital a pre-distortion parameter, and a pre-distortion system.

BACKGROUND

Along with the development of modern communication technologies, increasing attention has been paid to various nonlinear characteristics of power amplifiers, and the behavior model has also become a research focus in the field of microwave circuits. As compared with the traditional transistor-level circuit model, the analysis and the calculation in the behavior model has been greatly simplified while maintaining sufficient precision of the analysis of a nonlinear circuit, so the behavior model is particularly applicable to the analysis of performance of a broadband digital signal system, and thus expected to have a good application prospective in the researches on large-scale integrated circuits and pre-distortion technologies. The memory effect of the power amplifier has to be taken into account for the broadband communication system, so the traditional nonlinear model will not be applicable any longer. Currently the dynamic characteristic of the power amplifier is typically described using a memory-enabled polynomial, an artificial neural network, or another model. As compared with the behavior model based upon the artificial neural network, the modified Volterra series model can describe the physical definition of the nonlinear system more clearly, but the number of parameters for the model thereof increases exponentially with the increasing nonlinearity and memory length of the system, so the model can only be applicable to the research on a weakly-nonlinear system; otherwise, the model may suffer from the problem of calculation convergence.

There is a very serious memory effect of the power amplifier for a ultra-broadband signal according to inconsistent responses of the power amplifier to the signal at respective frequencies so that a signal output by the power amplifier is dependent upon both the signal at the current instance of time, and the preceding instance of time to the power amplifier, and apparently the memory depth of the power amplifier significantly increases with the increasing bandwidth of the signal. The power amplifier which is an analog device is a nonlinear system with nonlinear distortion of Amplitude Modulation-Amplitude Modulation (AM-AM) and Amplitude Modulation-Phase Modulation (AM-PM), where the AM-AM distortion refers to distortion in amplitude of an output signal relative to an input signal, for example, if the amplitude of the input signal drops below threshold voltage or rises above saturation voltage, then the output voltage signal may be clamped or capped, i.e., AM-AM distortion. The AM-PM distortion refers to that the difference in potential between the output signals and input signals varies with the varying amplitude of the input signal of the nonlinear power amplifier. If a narrow-band signal is input, then there will be such an insignificant influence of the memory effect that the AM-AM and AM-PM distortions of the power amplifier can be corrected for a better effect. As the bandwidth of the signal is increasing, particularly an ultra-broadband signal of 100 M in next-generation mobile communication, the memory effect of the power amplifier may be so serious that the power amplifier becomes a very complex system including both linear distortions and nonlinear distortions, and a theoretical complete expression of such a system is the modified Volterra series. Apparently the modified Volterra series is currently impractical and has to be simplified and optimized, and how to extract a dominating distortion model of the power amplifier, and to create a working, practicable, and low-overhead pre-distortion model of the power amplifier is a very challenging job.

In order to address this problem, the behavior model of the amplifier is typically created in recent years using some simplified models including the common Wiener model and Hammerstein model, where both of the models are greatly reduced in complexity and can be applicable to a strongly-nonlinear system, so they have been widely applied in the research on the nonlinear behavior model of the power amplifier. However these two models can not describe comprehensively the nonlinear characteristic of the power amplifier, and particularly can not define precisely the envelope memory effect of the power amplifier; and moreover neither Wiener model nor the Hammerstein model is a linear equation to be solved for the parameters of the models, making it difficult to extract the parameters of the model. The Memory Polynomial (MP) is another common behavior model which can be regarded as an extended Hammerstein model, but the required precision of the model may not be achieved. Accordingly it is desirable to create a more precise behavior model with linear parameters.

SUMMARY

Embodiments of the application provide a method for obtaining a pre-distortion parameter, and a pre-distortion system so as to simplify the calculation complexity of a model while achieving a good effect of processing a signal.

An embodiment of the application provides a method for obtaining a pre-distortion parameter, the method including:

after the beginning of periodic filtering, obtaining a pre-distorted signal, and a power-amplified first feedback signal, wherein the pre-distorted signal is obtained in the following pre-distortion model:

$$z(n) = \sum_{m=0}^{M-1} x(n-m) \sum_{q=1}^{Q} w_{m,q} |x(n-m)|^{(q-1)} +$$

$$\sum_{l=1}^{L_c} \sum_{m=0}^{M-1} x(n-m) \sum_{q=1}^{Q} w_{m,q-l} |x(n-m-l)|^{(q-1)} +$$

$$\sum_{l=1}^{L_c} \sum_{m=0}^{M-1} x(n-m) \sum_{q=1}^{Q} w_{m,q,l} |x(n-m+l)|^{(q-1)} +$$

-continued $$\sum_{l=1}^{L_c}\sum_{m=0}^{M-1} x^*(n-m) \cdot x^2(n-m-l) \sum_{q=1}^{Q} w_{m,q,-xl}|x(n-m-l)|^{(q-3)} +$$

$$\sum_{l=1}^{L_c}\sum_{m=0}^{M-1} x^*(n-m) \cdot x^2(n-m+l) \sum_{q=1}^{Q} w_{m,q,xl}|x(n-m+l)|^{(q-3)},$$

wherein z(n) represents the pre-distorted signal output at an instance of time n, x(n) represents an original signal input at the instance of time n, n represents the instance of time at which the original signal is input, m represents an instant of time at which the original signal is memorized, w represents a pre-distortion parameter, M represents a memory depth, Q represents a nonlinear order, L represents the maximum number of interleaving samples, q represents a nonlinear order index, * represents conjugation of the signal, l represents an interleaving sample, x(n−m) represents the original signal, and x*(n−m) represents a conjugated signal of the original signal;

removing a rated linear gain from the first feedback signal to obtain a second feedback signal;

determining the pre-distortion parameter according to a matrix formed from the second feedback signal, and a matrix formed from the pre-distorted signal; and updating a table of pre-distortion parameter indexes using the determined pre-distortion parameter.

In the technical solution above according to the embodiment of the application, a new digital pre-storing model is proposed to simplify the calculation complexity while achieving the performance of processing a signal.

Preferably the conjugated signal of the original signal in the pre-distortion model is replaced with the original signal according to the signal vector relationship between the original signal and the conjugated signal of the original signal, and the pre-distortion model in which the conjugated signal is replaced is as follows:

$$z(n) = \sum_{m=0}^{M-1} x(n-m) \sum_{q=1}^{Q} w_{m,q}|x(n-m)|^{(q-1)} +$$

$$\sum_{l=1}^{L_c}\sum_{m=0}^{M-1} x(n-m) \sum_{q=2}^{Q} w_{m,q,-l}|x(n-m-l)|^{(q-1)} +$$

$$\sum_{l=1}^{L_c}\sum_{m=0}^{M-1} x(n-m) \sum_{q=2}^{Q} w_{m,q,l}|x(n-m+l)|^{(q-1)} + \sum_{l=1}^{L_c}\sum_{m=0}^{M-1} x(n-m) \cdot$$

$$\exp(-j2\theta_{m1} + j2\theta_{m2}) \cdot \sum_{q=3}^{Q} w_{m,q,-xl}|x(n-m-l)|^{(q-1)} +$$

$$\sum_{l=1}^{L_c}\sum_{m=0}^{M-1} x(n-m) \cdot \exp(-j2\theta_{m1} + j2\theta_{m2}) \cdot \sum_{q=3}^{Q} w_{m,q,xl}|x(n-m+l)|^{(q-1)},$$

wherein $\exp(-j2\theta_{m1}+j2\theta_{m2})$ represents the vector relationship between the original signal and the conjugated signal of the original signal, and $\theta$ represents the complex angle of the original signal.

As can be apparent from the derivation of the equations above, in the technical solution according to the embodiment of the application, the temporally conjugated interleaving model in the pre-distortion model can be simplified to thereby lower the calculation complexity in the pre-distortion model as a whole and save the multiplier resources. Moreover the amplitude of the signal (i.e., the first feedback signal) can be obtained in an existing algorithm in which the complex angle of the signal is obtained together with the amplitude of the signal, so in the embodiment of the application, the model can be simplified using the existing resources without any additional resources, and thus can be implemented simply and conveniently.

More preferably the pre-distortion model in which the conjugated signal is replaced is further transformed into the following equation according to the correspondence relationship between the pre-distortion parameter in the table of pre-distortion parameter indexes, and the signal amplitude of the original signal:

$$z(n) = \sum_{m=0}^{M-1} x(n-m) \cdot \left\{ \begin{array}{l} LUT_m(|x(n-m)|) + \sum_{l=1}^{L_c} LUT_{m-l}(|x(n-m-l)|) + \\ \sum_{l=1}^{L_c} LUT_{m+l}(|x(n-m+l)|) + \\ \sum_{l=1}^{L_c} \exp(-j2\theta_{m1} + j2\theta_{m2}) \cdot LUT_{m-xl}(|x(n-m-l)|) + \\ \sum_{l=1}^{L_c} \exp(-j2\theta_{m1} + j2\theta_{m2}) \cdot LUT_{m+xl}(|x(n-m+l)|) \end{array} \right\},$$

wherein LUT represents the table of pre-distortion parameter indexes, and $LUT_m(|x(n-m)|)$ represents the pre-distortion parameter in the LUT table, corresponding to the signal amplitude $|x(n-m)|$ of the original signal.

In the technical solution according to the embodiment of the application, since there is a correspondence relationship between the pre-distortion parameter in the table of pre-distortion parameter indexes, and the signal amplitude of the original signal, the pre-distortion model can be further simplified by factoring out a common factor so as to lower the complexity of the pre-distortion model as a whole.

Generally removing the rated linear gain from the first feedback signal to obtain the second feedback signal includes:

removing the rated linear gain of the first feedback signal;
removing the rated linear gain of the conjugated signal of the first feedback signal; and
composing the second feedback signal from the first feedback signal, and the conjugated signal of the first feedback signal, from which the rated linear gain is removed.

Since the conjugated signal is designed for the pre-distortion model in the technical solution according to the embodiment of the application, when the rated linear gain is removed from the first feedback signal, the rated linear gain needs to be further removed from the conjugated signal of the first feedback signal.

Preferably determining the pre-distortion parameter according to the matrix formed from the second feedback signal, and the matrix formed from the pre-distorted signal includes:

substituting the matrix formed from the second feedback signal, and the matrix formed from the pre-distorted signal into the equation of $\hat{w}=(U^H U)^{-1} U^H z$ to determine the least squares solution of the pre-distortion parameter, wherein $\hat{w}$ represents the least squares solution of the pre-distortion parameter, z represents the matrix formed from the pre-distorted signal, U represents the matrix formed from the second feedback signal, and $U^H$ represents a conjugated matrix of the matrix U; and determining the pre-distortion parameter according to the least squares solution of the pre-distortion parameter.

In the technical solution according to the embodiment of the application, the linear equation can be solved under the least squares principle, and in reality, it can be solved for the coefficients of the matrix through QR decomposition or rapid Cholesky decomposition of the matrix);

An embodiment of the application further provides a digital pre-distorting system including:

a pre-distorter configured after periodical filtering, to pre-distort an input original signal, and to output the pre-distorted signal to a power amplifier; and to update a table of pre-distortion parameter indexes using a pre-distortion parameter transmitted by a calculator, wherein the pre-distorted signal is obtained in the following pre-distortion model:

$$z(n) = \sum_{m=0}^{M-1} x(n-m) \sum_{q=1}^{Q} w_{m,q} |x(n-m)|^{(q-1)} +$$

$$\sum_{l=1}^{L_c} \sum_{m=0}^{M-1} x(n-m) \sum_{q=1}^{Q} w_{m,q-l} |x(n-m-l)|^{(q-1)} +$$

$$\sum_{l=1}^{L_c} \sum_{m=0}^{M-1} x(n-m) \sum_{q=1}^{Q} w_{m,q,l} |x(n-m+l)|^{(q-1)} +$$

$$\sum_{l=1}^{L_c} \sum_{m=0}^{M-1} x^*(n-m) \cdot x^2(n-m-l) \sum_{q=1}^{Q} w_{m,q,-xl} |x(n-m-l)|^{(q-3)} +$$

$$\sum_{l=1}^{L_c} \sum_{m=0}^{M-1} x^*(n-m) \cdot x^2(n-m+l) \sum_{q=1}^{Q} w_{m,q,xl} |x(n-m+l)|^{(q-3)},$$

wherein z(n) represents the pre-distorted signal output at an instance of time n, x(n) represents the original signal input at the instance of time n, n represents the instance of time at which the original signal is input, m represents an instant of time at which the original signal is memorized, w represents the pre-distortion parameter, M represents a memory depth, Q represents a nonlinear order, L represents the maximum number of interleaving samples, q represents a nonlinear order index, * represents conjugation of the signal, l represents an interleaving sample, x(n−m) represents the original signal, and x*(n−m) represents a conjugated signal of the original signal; and the power amplifier configured to amplify power of the pre-distorted signal output by the pre-distorter, and to output a first feedback signal to the calculator; and the calculator configured to obtain the pre-distorted signal and the first feedback signal, and to remove a rated linear gain from the first feedback signal to obtain a second feedback signal; and to determine the pre-distortion parameter according to a matrix formed from the second feedback signal, and a matrix formed from the pre-distorted signal; and to transmit the determined pre-distortion parameter to the pre-distorter.

In the technical solution above according to the embodiment of the application, a new digital pre-storing model is proposed, and the pre-distorter processes the original signal using the model according to the embodiment of the application for the effect of both guaranteeing the performance of processing the signal in the system as a whole, and simplifying the calculation complexity.

The embodiments of the application provide a new pre-distortion model, which is a PVS model that can be tailored, and to which the model of the interleaving items is added as compared with the MP model, where the architecture approximating the MP model is applied so that on one hand, the calculation complexity in the model can be greatly lowered, and on the other hand, dominating nonlinearity of the power amplifier can be reflected effectively.

DETAILED DESCRIPTION OF THE EMBODIMENTS

Since the common digital pre-distortion models in the prior art fails to achieve both the performance of processing a signal, and the calculation complexity, embodiments of the application provide a method for obtaining a pre-distortion parameter, and a pre-distorting system so as to simplify the calculation complexity of the model while achieving a good effect of processing a signal.

Figure 1:
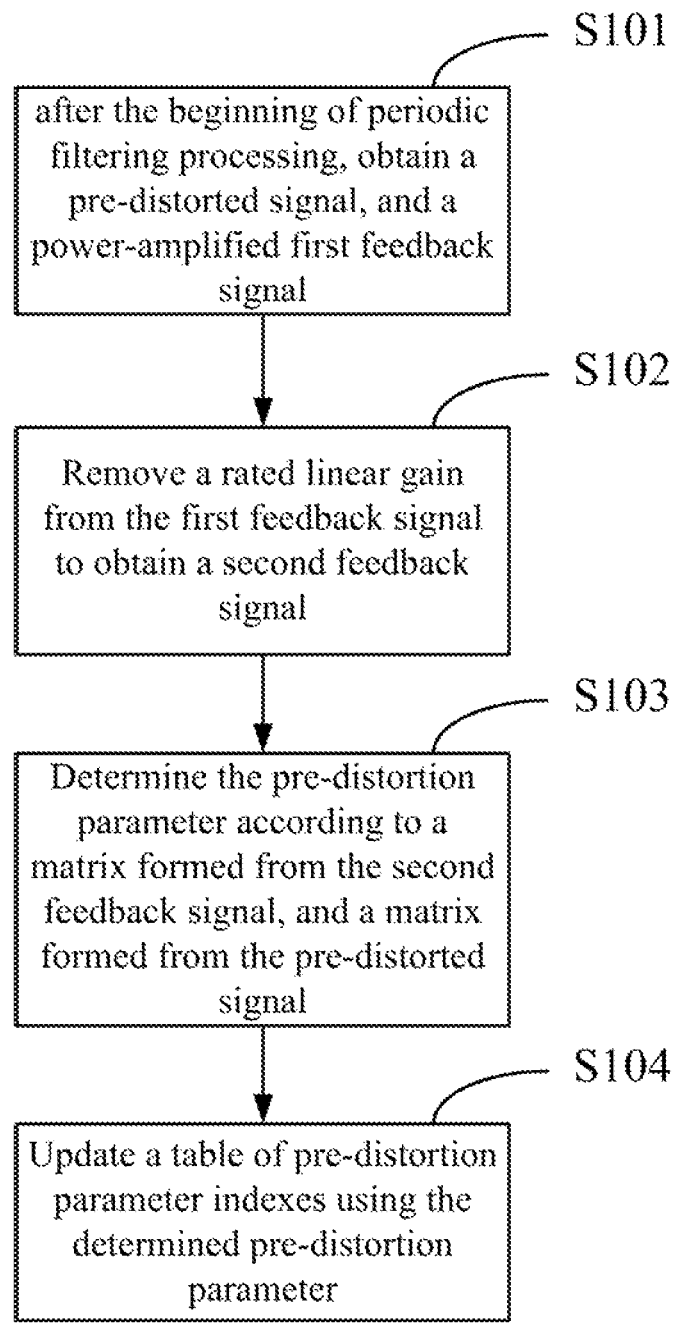
FIG. 1 is a schematic flow chart of a method for obtaining a digital pre-distortion parameter according to an embodiment of the application.

Firstly an embodiment of the application provides a method for obtaining a pre-distortion parameter as illustrated in FIG. 1, where the method includes:

S101 is after the beginning of periodic filtering processing, to obtain a pre-distorted signal, and a power-amplified first feedback signal, where the pre-distorted signal is obtained in the following pre-distortion model:

$$z(n) = \sum_{m=0}^{M-1} x(n-m) \sum_{q=1}^{Q} w_{m,q} |x(n-m)|^{(q-1)} +$$

$$\sum_{l=1}^{L_c} \sum_{m=0}^{M-1} x(n-m) \sum_{q=1}^{Q} w_{m,q-l} |x(n-m-l)|^{(q-1)} +$$

$$\sum_{l=1}^{L_c} \sum_{m=0}^{M-1} x(n-m) \sum_{q=1}^{Q} w_{m,q,l} |x(n-m+l)|^{(q-1)} +$$

$$\sum_{l=1}^{L_c}\sum_{m=0}^{M-1} x^*(n-m)\cdot x^2(n-m-l)\sum_{q=1}^{Q} w_{m,q,-xl}|x(n-m-l)|^{(q-3)} +$$

$$\sum_{l=1}^{L_c}\sum_{m=0}^{M-1} x^*(n-m)\cdot x^2(n-m+l)\sum_{q=1}^{Q} w_{m,q,xl}|x(n-m+l)|^{(q-3)}$$

Where z(n) represents a pre-distorted signal output at an instance of time n, x(n) represents an original signal input at the instance of time n, n represents the instance of time at which the original signal is input, m represents an instant of time at which the original signal is memorized, w represents a pre-distortion parameter, M represents a memory depth, Q represents a nonlinear order, L represents the maximum number of interleaving samples, q represents a nonlinear order index, * represents conjugation of the signal, l represents an interleaving sample, x(n−m) represents the original signal, and x*(n−m) represents a conjugated signal of the original signal;

S102 is to remove a rated linear gain from the first feedback signal to obtain a second feedback signal;

S103 is to determine the pre-distortion parameter according to a matrix formed from the second feedback signal, and a matrix formed from the pre-distorted signal; and S104 is to update a table of pre-distortion parameter indexes using the determined pre-distortion parameter.

In the embodiment above of the application, a new digital pre-storing model is proposed to simplify the calculation complexity while achieving the performance of processing the signal.

The pre-distorting model proposed according to the embodiment of the application is actually a PVS model which is a PVS model between the MP model and the modified Volterra series model, and this model reflects the nonlinear characteristic of a power amplifier more comprehensively using a sequence of interleaving items at adjacent instances of time. The PVS model can also be regarded as such a model tailored from the Volterra model that is put into use simply by configuring a nonlinear order Q, the memory depth M, and the maximum number of interleaving samples L to characterize the model comprehensively. As can be apparent from observing carefully the pre-distortion model in the embodiment of the application, the large model as a whole includes three small models tailored from the Volterra model particularly as follows:

1) The memory polynomial MP model $z_{mp}(n)$;
2) The temporally interleaving memory polynomial $z_{mp-cl}(n)$ $z_{mp+cl}(n)$; and
3) The temporally interleaving conjugated memory polynomials $z_{mp-tl}(n)$ and $z_{mp+tl}(n)$, where these models are defined particularly as follows:

$$z_{mp}(n) = \sum_{m=0}^{M-1} x(n-m) \sum_{q=1}^{Q} w_{m,q}|x(n-m)|^{(q-1)}$$

$$z_{mp-cl}(n) = \sum_{l=1}^{L_c}\sum_{m=0}^{M-1} x(n-m)\sum_{q=2}^{Q} w_{m,q,-l}|x(n-m-l)|^{(q-1)}$$

$$z_{mp+cl}(n) = \sum_{l=1}^{L_c}\sum_{m=0}^{M-1} x(n-m)\sum_{q=2}^{Q} w_{m,q,l}|x(n-m+l)|^{(q-1)}$$

$$z_{mp-tl}(n) = \sum_{l=1}^{L_c}\sum_{m=0}^{M-1} x^*(n-m)\cdot x^2(n-m-l)\sum_{q=3}^{Q} w_{m,q,-xl}|x(n-m-l)|^{(q-3)}$$

$$z_{mp+tl}(n) = \sum_{l=1}^{L_c}\sum_{m=0}^{M-1} x^*(n-m)\cdot x^2(n-m+l)\sum_{q=3}^{Q} w_{m,q,xl}|x(n-m+l)|^{(q-3)}$$

In the embodiment of the application, the general pre-distortion model in the embodiment of the application is composed of these three small models so that the calculation complexity is lowered significantly as compared with the original Volterra model, and in the tests made by the inventors, the performance of four carriers (80 MHz) in the Long Term Evolution (LTE) system was tested using the pre-distortion model in the embodiment of the application so that the Adjacent Channel power Ratio (ACPR) was raised by 5 to 6 dBc as compared with the traditional MP model.

As can be appreciated that the pre-distortion model in the embodiment of the application involves the product of the squares of the conjugated item and the signal, which requires a large number of multipliers, and in order to further attain the object of saving the calculation complexity, further to the embodiment above of the application, the conjugated signal of the original signal in the pre-distortion model is replaced with the original signal according to the signal vector relationship between the original signal and the conjugated signal of the original signal, where the pre-distortion model in which the conjugated signal is replaced is as follows:

$$z(n) = \sum_{m=0}^{M-1} x(n-m)\sum_{q=1}^{Q} w_{m,q}|x(n-m)|^{(q-1)} +$$

$$\sum_{l=1}^{L_c}\sum_{m=0}^{M-1} x(n-m)\sum_{q=2}^{Q} w_{m,q,-l}|x(n-m-l)|^{(q-1)} +$$

$$\sum_{l=1}^{L_c}\sum_{m=0}^{M-1} x(n-m)\sum_{q=2}^{Q} w_{m,q,l}|x(n-m+l)|^{(q-1)} + \sum_{l=1}^{L_c}\sum_{m=0}^{M-1} x(n-m)\cdot$$

$$\exp(-j2\theta_{m1}+j2\theta_{m2})\cdot\sum_{q=3}^{Q} w_{m,q,-xl}|x(n-m-l)|^{(q-1)} +$$

$$\sum_{l=1}^{L_c}\sum_{m=0}^{M-1} x(n-m)\cdot\exp(-j2\theta_{m1}+j2\theta_{m2})\cdot\sum_{q=3}^{Q} w_{m,q,xl}|x(n-m+l)|^{(q-1)}$$

Where $\exp(-j2\theta_{m1}+j2\theta_{m2})$ represents the vector relationship between the original signal and the conjugated signal of the original signal, and θ represents the complex angle of the original signal.

Figure 2:
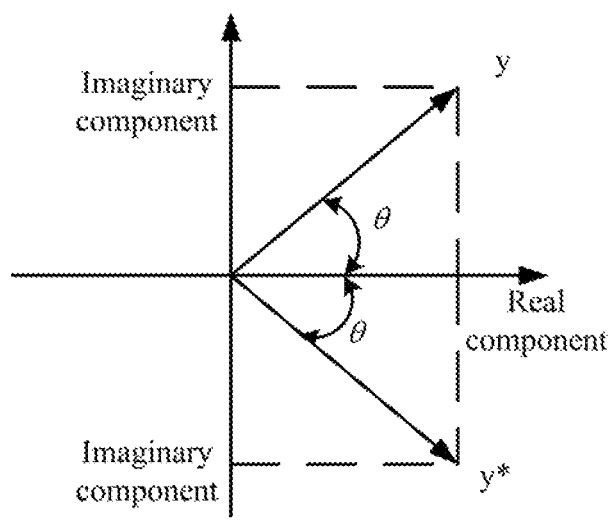
FIG. 2 is a schematic diagram of a phase relationship between an original signal and a conjugated signal according to an embodiment of the application.

As illustrated in FIG. 2 showing clearly the relationship between the conjugated signal and the original signal, the amplitude of the conjugated signal in the temporally interleaving conjugated memory polynomial can be replaced with the amplitude of the original signal according to the complex angle relationship between the conjugated signal and the original signal particularly as follows:

As illustrated, apparently:

$\theta_1 = ac\tan(\text{imag}(x(n-m))/\text{real}(x(n-m)))$.

$\theta_2 = a\tan(\text{imag}(x(n-m-l))/\text{real}(x(n-m-l)))$;

So the amplitude of the conjugated signal is $x^*(n-m)=x(n-m)\cdot\exp(-j2\theta_1)$; and The square of the amplitude of the original signal is:

$$x^2(n-m-l)=x(n-m-l)x^*(n-m-l)\cdot\exp(j2\theta_2)=|x(n-m-l)|^2\cdot\exp(j2\theta_2). \quad (5)$$

As can be apparent from the derivation of the equations above, in the embodiment of the application, the temporally conjugated interleaving model in the pre-distortion model can be simplified to thereby lower the calculation complexity in the pre-distortion model and save the multiplier resources. Moreover the amplitude of the signal (i.e., the original signal) can be obtained in an existing algorithm in which the complex angle of the signal is obtained together with the amplitude of the signal, e.g., the CORDIC algorithm in which the complex angle of a signal is obtained together with the amplitude of the signal, so in the embodiment of the application, the model can be simplified using the existing resources without any additional resources, and thus can be implemented simply and conveniently.

Furthermore since there is a correspondence relationship between the pre-distortion parameter in the table of pre-distortion parameter indexes, and the signal amplitude of the original signal, as can be apparent from observing carefully the simplified pre-distortion model in the embodiment of the application, the pre-distortion model can be further simplified by factoring out a common factor as follows:

Firstly we know that an LUT represents a table of indexes of a pre-distortion parameter, and for the sake of convenient understanding, the LUT table can be generated as outlined below:

If the maximum value of the input signal is $mv=\max(|y(n)|)$, and the maximum size of the LUT is A, then the amplitude interval in the LUT table will be $$\Delta = \frac{mv}{A}.$$

Further to this assumption, the LUT can be generated as follows:

$$LUT_{m,l,xl}(a\Delta) = \sum_{q=1}^{Q} w^{(1)}_{m,q,l,xl} \cdot (a\Delta)^q,$$

$$\begin{pmatrix} m = 0 \ldots M-1, q = 1 \ldots Q, \\ l = -L \ldots L, xl = -L \ldots L, a = 1 \ldots A \end{pmatrix}.$$

As can be apparent from this equation, a storage space of the LUT has the length of $A*(4L+1)*M$.

$LUT_m(|x(n-m)|)$ represents the corresponding pre-distortion parameter with the amplitude $|x(n-m)|$ of the input original signal being an index, and also since:

$$LUT_m(|x(n-m)|) = \sum_{q=1}^{Q} w_{m,q} |x(n-m)|^{(q-1)},$$

$(m = 1 \ldots M-1, n = 1 \ldots N)$ $$LUT_{m-l}(|x(n-m-l)|) = \sum_{q=2}^{Q} w_{m,q,-l} |x(n-m-l)|^{(q-1)},$$

$(m = 0 \ldots M-1, n = 1 \ldots N)$ $$LUT_{m+l}(|x(n-m+l)|) = \sum_{q=2}^{Q} w_{m,q,l} |x(n-m+l)|^{(q-1)},$$

$(m = 0 \ldots M-1, n = 1 \ldots N)$ $$LUT_{m-xl}(|x(n-m-l)|) = \sum_{q=2}^{Q} w_{m,q,-xl} |x(n-m-l)|^{(q-1)},$$

$(m = 0 \ldots M-1, n = 1 \ldots N)$ $$LUT_{m+xl}(|x(n-m+l)|) = \sum_{q=3}^{Q} w_{m,q,xl} |x(n-m+l)|^{(q-1)},$$

$(m = 0 \ldots M-1, n = 1 \ldots N)$

The equation (2) above can be simplified as follows:

$$z(n) = \sum_{m=0}^{M-1} x(n-m) \cdot LUT_m(|x(n-m)|) + \quad (3)$$

$$\sum_{l=1}^{L_c} \sum_{m=0}^{M-1} x(n-m) \cdot LUT_{m-l}(|x(n-m-l)|) +$$

$$\sum_{l=1}^{L_c} \sum_{m=0}^{M-1} x(n-m) \cdot LUT_{m+l}(|x(n-m+l)|) +$$

$$\sum_{l=1}^{L_c} \sum_{m=0}^{M-1} x(n-m) \cdot \exp(-j2\theta_{m1} + j2\theta_{m2}) \cdot LUT_{m-xl}(|x(n-m-l)|) +$$

$$\sum_{l=1}^{L_c} \sum_{m=0}^{M-1} x(n-m) \cdot \exp(-j2\theta_{m1} + j2\theta_{m2}) \cdot LUT_{m+xl}(|x(n-m+l)|)$$

Further to the equation (3), furthermore the pre-distortion model can be simplified as follows by factoring out the common factor:

$$z(n) = \sum_{m=0}^{M-1} x(n-m) \cdot \quad (4)$$

$$\left\{ \begin{array}{l} LUT_m(|x(n-m)|) + \sum_{l=1}^{L_c} LUT_{m-l}(|x(n-m-l)|) + \\ \sum_{l=1}^{L_c} LUT_{m+l}(|x(n-m+l)|) + \sum_{l=1}^{L_c} \exp(-j2\theta_{m1} + j2\theta_{m2}) \cdot \\ \qquad LUT_{m-xl}(|x(n-m-l)|) + \\ \sum_{l=1}^{L_c} \exp(-j2\theta_{m1} + j2\theta_{m2}) \cdot LUT_{m+xl}(|x(n-m+l)|) \end{array} \right\}$$

Since the common factor is factored out from the pre-distortion model in the equation (4), the calculation difficulty can be greatly lowered.

In general, the pre-distortion model in the embodiment above can be simplified into the equation (4) by simplifying the temporally interleaving conjugated memory polynomial in the pre-distortion model.

If the calculation difficulty in the pre-distortion model needs to be further lowered in reality, then in the embodiment of the application, this can be done by simplifying the temporally interleaving memory polynomial model component further to the equation (3).

Firstly before the model component is simplified, the reason for the simplification to be possible will be described as follows: the influence of the temporally interleaving items in the temporally interleaving memory polynomial decreases with the increasing memory depth, that is, the interleaving components of the signal become further from the diagonal, and the influence thereof upon the system decreases, with the increasing memory depth, so in order to lower the calculation complexity, the temporally interleaving items with a too large memory depth in the interleaving memory polynomial can be omitted to thereby lower the calculation complexity. Stated otherwise, the number of temporally interleaving items is changed from the maximum memory depth to the maximum memory depth minus the maximum number of interleaving samples, so the interleaving memory polynomial model component $z_{mpcl}(n)$ in the pre-distortion model can be simplified as follows:

$$z_{mpcl}(n) = \sum_{l=1}^{L_c} \sum_{m=0}^{M-1-L} x(n-m) \sum_{q=2}^{Q} w_{m,q,-l} |x(n-m-l)|^{(q-1)} + \quad (5)$$

$$\sum_{l=1}^{L_c} \sum_{m=L}^{M-1} x(n-m) \sum_{q=2}^{Q} w_{m,q,l} |x(n-m+l)|^{(q-1)}$$

In general, the pre-distortion model in the embodiment of the application can be finally simplified as follows in the equation (3) and the equation (5):

$$z(n) = \sum_{m=0}^{M-1} x(n-m) \cdot LUT_m(|x(n-m)|) + \quad (6)$$

$$\sum_{l=1}^{L_c} \sum_{m=0}^{M-1-L} x(n-m) \cdot LUT_{m-l}(|x(n-m-l)|) +$$

$$\sum_{l=1}^{L_c} \sum_{m=0}^{M-1} x(n-m) \cdot LUT_{m+l}(|x(n-m+l)|) +$$

$$\sum_{l=1}^{L_c} \sum_{m=0}^{M-1-L} x(n-m) \cdot \exp(-j2\theta_{m1} + j2\theta_{m2}) \cdot LUT_{m-xl}(|x(n-m-l)|) +$$

$$\sum_{l=1}^{L_c} \sum_{m=0}^{M-1} x(n-m) \cdot \exp(-j2\theta_{m1} + j2\theta_{m2}) \cdot LUT_{m+xl}(|x(n-m+l)|)$$

In the embodiment of the application, since the existing influence of the temporally interleaving items in the temporally interleaving memory polynomial decreases with the increasing memory depth, the overall calculation complexity of the general pre-distortion model can be lowered by omitting some temporally interleaving items with the large memory depth in the temporally interleaving memory polynomial model.

In summary, in the reasoning of the respective embodiments above and the derivation of the equations thereof, the inventors have demonstrated that the inventive object of the embodiment of the application can be attained using any one of the equations (1), (4) or (6) to thereby lower the calculation complexity in the pre-distortion model while improving the performance of processing the signal.

The excellent performance of the pre-distortion model in the embodiment of the application has been demonstrated in the respective embodiments above, and the process of obtaining a pre-distortion parameter according to the embodiment of the application will be described below in details by way of some particular embodiments thereof.

Generally in order to obtain the pre-distortion parameter accurately, the rated linear gain is removed from the first feedback signal to obtain the second feedback signal particularly as follows:

To remove the rated linear gain of the first feedback signal;

To remove the rated linear gain of the conjugated signal of the first feedback signal; and To compose the second feedback signal from the first feedback signal, and the conjugated signal of the first feedback signal, from which the rated linear gain is removed.

Generally the rated linear gain of the first feedback signal is removed in the equation of:

$$u_{m,q,l_{1,t}}(n) = \frac{y(n-m)}{G} \left| \frac{y(n-m \mp l)}{G} \right|^q,$$

$$(0 \le l \le L, m = 1 \ldots M, q = 1 \ldots Q),$$

where y represents the first feedback signal, u represents the first feedback signal from which the rated linear gain is removed, G represents the rated linear gain, n represents the instance of time at which the first feedback signal is input, m represents the instance of time at which the first feedback signal is memorized, M represents the memory depth, Q represents the nonlinear order, L represents the maximum numbers of interleaving samples, q represents the nonlinear order index, and l represents the interleaving sample; and The rated linear gain of the conjugated signal of the first feedback signal is removed in the equation of:

$$u^*_{m,q,l_{1,t}}(n) = \frac{y^*(n-m)}{G} y^2(n-m) \left| \frac{y(n-m \mp l)}{G} \right|^{q-3},$$

$$(0 \le l \le L, m = 1 \ldots M, q = 3 \ldots Q),$$

where y* represents the conjugated signal of the first feedback signal, u* represents the conjugated signal of the first feedback signal, from which the rated linear gain of the power amplifier is removed, G represents the rated linear gain, n represents the instance of time at which the first feedback signal is input, m represents the instance of time at which the first feedback signal is memorized, M represents the memory depth, Q represents the nonlinear order, L represents the maximum numbers of interleaving samples, q represents the nonlinear order index, and l represents the interleaving sample.

In the embodiment of the application, as can be appreciated, since the pre-distortion model includes the first feedback signal, and the conjugated signal of the first feedback signal, the rated linear gain needs to be removed by calculating the signals in the two equations above, resulting in the matrix U of the second feedback signal from all the $u^*_{m,q,l_{1,t}}(n)$ and $u_{m,q,l_{1,t}}(n)$ together.

Preferably the pre-distortion parameter are determined according to the matrix formed from the second feedback signal, and the matrix formed from the pre-distorted signal particularly as follows:

The matrix formed from the second feedback signal, and the matrix formed from the pre-distorted signal are substituted into the equation of $\hat{w}=(U^H U)^{-1} U^H z$ to determine the least squares solution of the pre-distortion parameter, where ŵ represents the least squares solution of the pre-distortion parameter, z represents the matrix formed from the pre-distorted signal, U represents the matrix formed from the second feedback signal, and $U^H$ represents a conjugated matrix of the matrix U; and The pre-distortion parameter is determined according to the least squares solution of the pre-distortion parameter.

As can be appreciated that since the pre-distortion model indefinitely approximates the module of the power amplifier, the following relationship equation can be determined between the pre-distortion signal z and the first feedback signal y:

$$z(n) = \sum_{m=0}^{M-1} y(n-m) \sum_{q=1}^{Q} w_{m,q} |y(n-m)|^{(q-1)} +$$

$$\sum_{l=1}^{L_c} \sum_{m=0}^{M-1} y(n-m) \sum_{q=1}^{Q} w_{m,q,-l} |y(n-m-l)|^{(q-1)} +$$

$$\sum_{l=1}^{L_c} \sum_{m=0}^{M-1} y(n-m) \sum_{q=1}^{Q} w_{m,q,l} |y(n-m+l)|^{(q-1)} +$$

$$\sum_{l=1}^{L_c} \sum_{m=0}^{M-1} y^*(n-m) \cdot y^2(n-m-l) \sum_{q=1}^{Q} w_{m,q,-xl} |y(n-m-l)|^{(q-3)} +$$

$$\sum_{l=1}^{L_c} \sum_{m=0}^{M-1} y^*(n-m) \cdot y^2(n-m+l) \sum_{q=1}^{Q} w_{m,q,xl} |y(n-m+l)|^{(q-3)}$$

According to the relationship above, the pre-distortion parameter is calculated according to the relationship equation above between the first feedback signal and the pre-distortion signal in the embodiment of the application, and after the matrix of the second feedback signal, and the matrix of the pre-distortion signal are obtained, the relationship equation above can be transformed into the matrix relationship equation of z=Uw, which can be transformed in the LS algorithm so that the least squares solution of the pre-distortion parameter is calculated as $ŵ=(U^H U)^{-1} U^H z$, and since the calculation of the least squares solution of the pre-distortion parameter involves complex calculation of an inverse of the matrix, the matrix can be decomposed instead of calculating the inverse of the matrix, for example, the matrix is decomposed commonly through Orthogonal-triangular Decomposition (QR), Singular Value Decomposition (SVD), etc. Moreover the inverse of the matrix can also be avoided from being calculated, in an adaptive LS algorithm, e.g., the Recursive Least Square (RLS) algorithm.

In summary, the description above of the application has demonstrated that the pre-distortion model in the embodiment of the application has the following advantages:

1. The model of the interleaving items is added to the PVS mode in the embodiment of the application as compared with the MP model, where the architecture approximating the MP model is applied so that on one hand, the complexity of the model can be greatly saved, and on the other hand, dominating nonlinearity of the power amplifier can be reflected effectively.

2. The PVS model in the embodiment of the application is a model which can be tailored, so that the configured parameters corresponding to the power amplifier (the non-linear order, the memory depth, and the interleaving sample) can be adjusted adaptively to the real condition of the power amplifier so as to satisfy the demand of the different power amplifier.

3. The common factor of the respective small models in the PVS model in the embodiment of the application can be factored out to thereby simplify the complexity of the overall model algorithm and improve the performance of the processing the signal.

Figure 3:
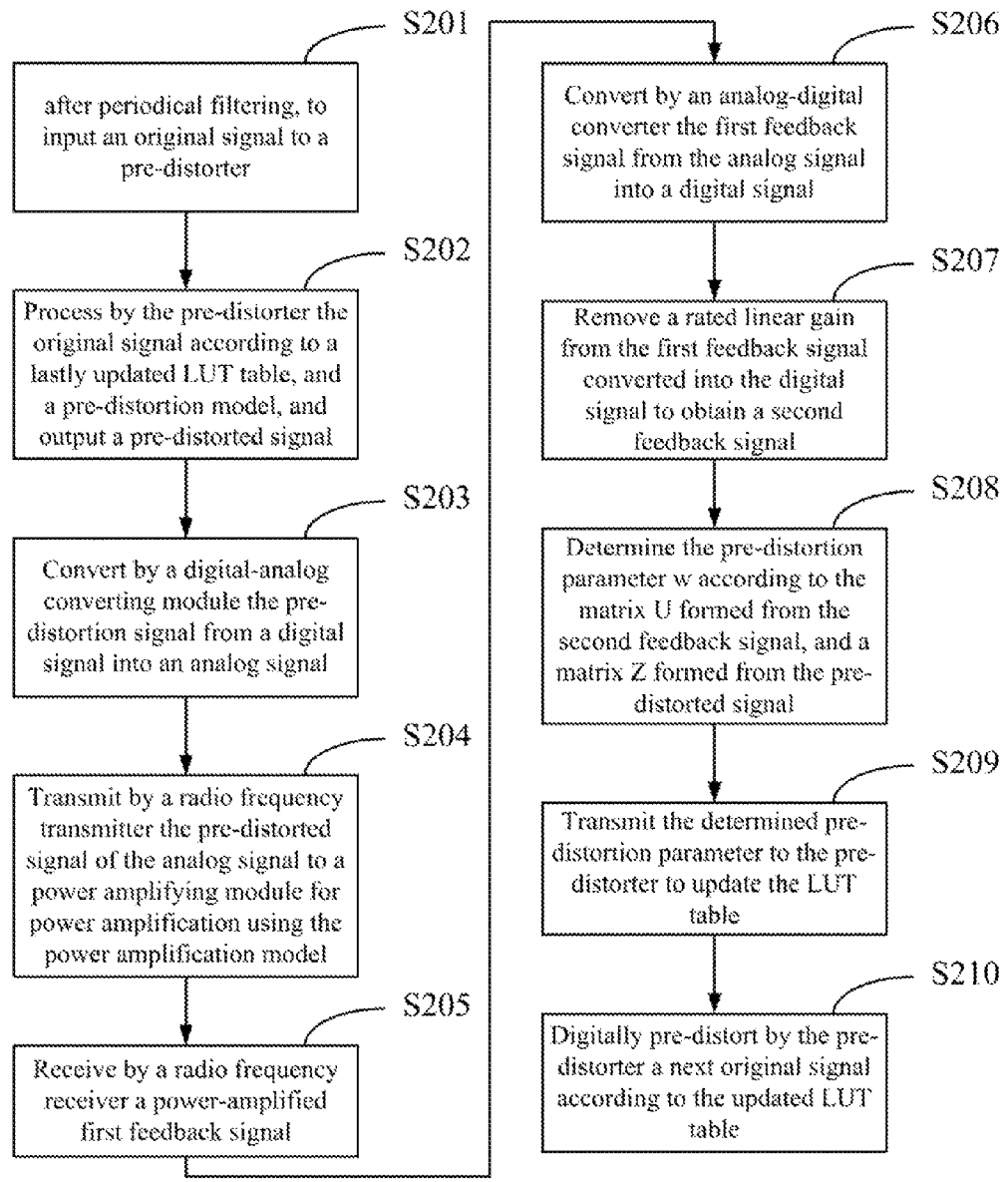
FIG. 3 is a schematic flow chart of a particular embodiment of a method for obtaining a digital pre-distortion parameter according to an embodiment of the application.
Figure 5:
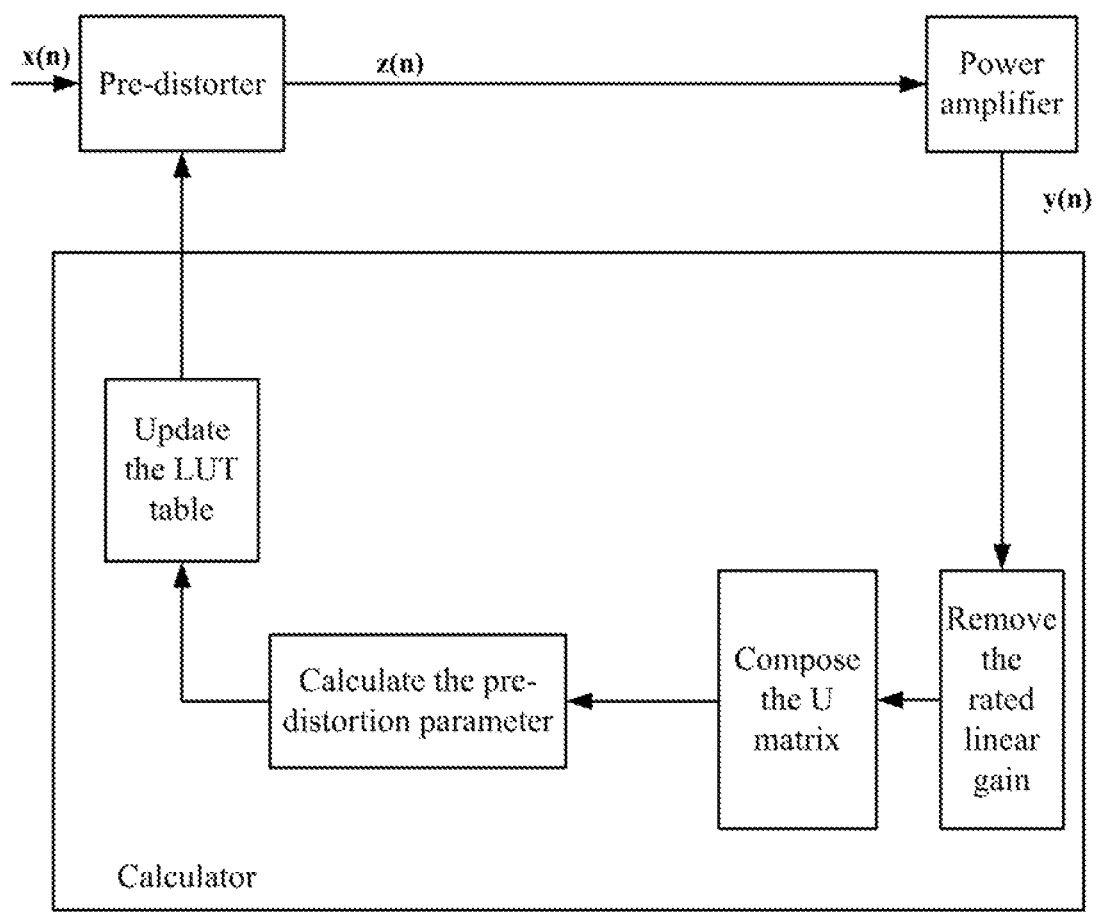
FIG. 5 is a schematic signal flow chart in a digital pre-distorting system according to an embodiment of the application.

In order to better understand a method for deriving a pre-distortion parameter according to an embodiment of the application, there is a detailed implementation thereof as illustrated in FIG. 3 and FIG. 5, where the pre-distortion model is embodied in the equation (3) in this embodiment:

Firstly the denominators or symbols appearing in the following embodiment will be defined collectively:

x(n) represents an original signal input at an instance of time n, z(n) represents a pre-distorted signal output at the instance of time n, y(n) represents a first feedback signal, n represents the instance of time at which the signal is input, m represents an instant of time at which the signal is memorized, w represents a pre-distortion parameter, M represents a memory depth, Q represents a nonlinear order, L represents the maximum number of interleaving samples, q represents a nonlinear order index, * represents conjugation of the signal, l represents an interleaving sample, x(n−m) represents the signal amplitude of the original signal, x*(n−m) represents the signal amplitude of a conjugated signal of the original signal, y(n−m) represents the signal amplitude of the first feedback signal, y*(n−m) represents the signal amplitude of a conjugated signal of the first feedback signal, G represents a rated linear gain, u represents the first feedback signal from which the rated linear gain is removed, y* represents a conjugated signal of the first feedback signal, u* represents the conjugated signal of the first feedback signal, from which the rated linear gain is removed, U represents a matrix of a second feedback signal, ŵ represents the least squares solution of the pre-distortion parameter, and $U^H$ represents a conjugated matrix of the matrix U.

S201 is after periodical filtering, to input an original signal to a pre-distorter;

S202 is to process by the pre-distorter the original signal according to a lastly updated LUT table, and a pre-distortion model, and to output a pre-distorted signal, where;

(1) The pre-distorter extracts corresponding pre-distortion parameters from the lastly updated LUT table according to different amplitudes of the input original signal; and (2) The pre-distorter processes the original signal in the equation below to obtain the pre-distorted signal:

$$z(n) = \sum_{m=0}^{M-1} x(n-m) \cdot \left\{ \begin{array}{l} LUT_m(|x(n-m)|) + \\ \sum_{l=1}^{L_c} LUT_{m-l}(|x(n-m-l)|) + \\ \sum_{l=1}^{L_c} LUT_{m+l}(|x(n-m+l)|) + \\ \sum_{l=1}^{L_c} \exp(-j2\theta_{m1} + j2\theta_{m2}) \cdot LUT_{m-xl} \\ (|x(n-m-l)|) + \\ \sum_{l=1}^{L_c} \exp(-j2\theta_{m1} + j2\theta_{m2}) \cdot LUT_{m+xl} \\ (|x(n-m+l)|) \end{array} \right\}$$

S203 is to convert by a digital-analog converting module the pre-distortion signal from a digital signal into an analog signal;

S204 is to transmit by a radio frequency transmitter the pre-distorted signal of the analog signal to a power amplifying module for power amplification;

S205 is to receive by a radio frequency receiver a power-amplified first feedback signal;

S206 is to convert by an analog-digital converter the first feedback signal from the analog signal into a digital signal;

S207 is to remove a rated linear gain from the first feedback signal converted into the digital signal to obtain a second feedback signal, where:

(1) The rated linear gain of the first feedback signal is removed in the equation of:

$$u(n) = \frac{y(n-m)}{G}\left|\frac{y(n-m\mp l)}{G}\right|^q,$$
$$(0 \leq l \leq L, m = 1 \ldots M, q = 1 \ldots Q);$$

(2) The rated linear gain of the conjugated signal of the first feedback signal is removed in the equation of:

$$u^*(n) = \frac{y^*(n-m)}{G}y^2(n-m)\left|\frac{y(n-m\mp l)}{G}\right|^{q-3},$$
$$(0 \leq l \leq L, m = 1 \ldots M, q = 3 \ldots Q);$$

(3) A matrix of the second feedback signal is represented as $U=u+u^*=[u_{10}, \ldots U_{M00}, \ldots u_{1Q}, \ldots u_{MQL}]$; and (4) Thus the relationship equation between the second feedback signal and the pre-distorted signal can be simplified into $z(n)=Uw$ (7);

S208 is to determine the pre-distortion parameter w according to the matrix U formed from the second feedback signal, and a matrix Z formed from the pre-distorted signal, where:

(1) The equation (7) can be transformed into $\hat{w}=(U^H U)^{-1}U^H z$, and the matrix formed from the pre-distorted signal, and the matrix formed from the second feedback signal can be substituted into the equation (7) to determine the least squares solution of the pre-distortion parameter w (because this equation is a set of over-determined equations. In this embodiment, the linear equation can be solved under the least squares principle, and in reality, it can be solved for the coefficients of the matrix through QR decomposition or rapid Cholesky decomposition of the matrix);

S209 is to transmit the determined pre-distortion parameter to the pre-distorter to update the LUT table; and S210 is to digitally pre-distort by the pre-distorter a next original signal according to the updated LUT table.

Figure 4:
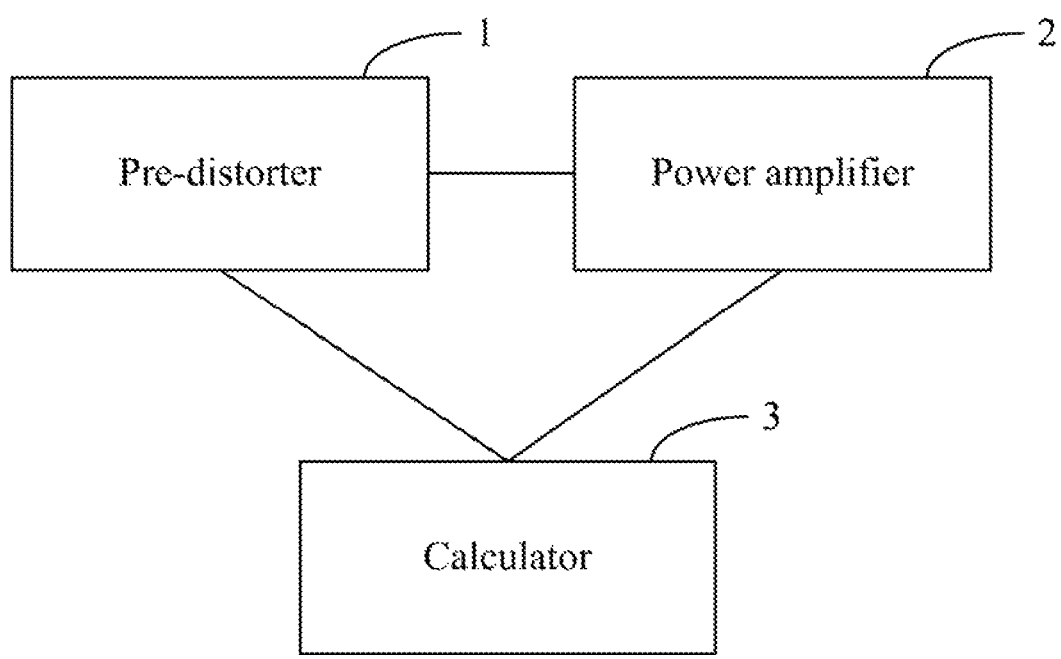
FIG. 4 is a schematic structural diagram of a digital pre-distorting system according to an embodiment of the application.

In correspondence to the method above according to the embodiment of the application, an embodiment of the application further provides a digital pre-distorting system as illustrated in FIG. 4, where the system includes:

A pre-distorter 1 is configured after periodical filtering to pre-distort an input original signal, and to output the pre-distorted signal to a power amplifier; and to update a table of pre-distortion parameter indexes using a pre-distortion parameter transmitted by a calculator;

The power amplifier 2 is configured to amplify power of the pre-distorted signal output by the pre-distorter, and to output a first feedback signal to the calculator, where the pre-distorted signal is obtained in the following pre-distortion model:

$$z(n) = \sum_{m=0}^{M-1} x(n-m)\sum_{q=1}^{Q} w_{m,q}|x(n-m)|^{(q-1)} +$$

$$\sum_{l=1}^{L_c}\sum_{m=0}^{M-1} x(n-m)\sum_{q=1}^{Q} w_{m,q,-l}|x(n-m-l)|^{(q-1)} +$$

$$\sum_{l=1}^{L_c}\sum_{m=0}^{M-1} x(n-m)\sum_{q=1}^{Q} w_{m,q,l}|x(n-m+l)|^{(q-1)} +$$

$$\sum_{l=1}^{L_c}\sum_{m=0}^{M-1} x^*(n-m)\cdot x^2(n-m-l)\sum_{q=1}^{Q} w_{m,q,-xl}|x(n-m-l)|^{(q-3)} +$$

$$\sum_{l=1}^{L_c}\sum_{m=0}^{M-1} x^*(n-m)\cdot x^2(n-m+l)\sum_{q=1}^{Q} w_{m,q,xl}|x(n-m+l)|^{(q-3)}$$

Where z(n) represents the pre-distorted signal output at an instance of time n, x(n) represents the original signal input at the instance of time n, n represents the instance of time at which the original signal is input, m represents an instant of time at which the original signal is memorized, w represents the pre-distortion parameter, M represents a memory depth, Q represents a nonlinear order, L represents the maximum number of interleaving samples, q represents a nonlinear order index, * represents conjugation of the signal, l represents an interleaving sample, x(n−m) represents the original signal, and x*(n−m) represents a conjugated signal of the original signal; and The calculator 3 is configured to obtain the pre-distorted signal and the first feedback signal, and to remove a rated linear gain from the first feedback signal to obtain a second feedback signal; and to determine the pre-distortion parameter according to a matrix formed from the second feedback signal, and a matrix formed from the pre-distorted signal; and to transmit the determined pre-distortion parameter to the pre-distorter.

In the embodiment above of the application, a new digital pre-storing model is proposed, and the pre-distorter processes the signal using the model according to the embodiment of the application for the effect of both guaranteeing the performance of processing the signal in the system as a whole, and simplifying the calculation complexity.

Preferably further to the embodiment above of the application, the conjugated signal of the original signal in the pre-distortion model is replaced with the original signal according to the signal vector relationship between the original signal and the conjugated signal of the original signal, where the pre-distortion model in which the conjugated signal is replaced is as follows:

$$z(n) = \sum_{m=0}^{M-1} x(n-m)\sum_{q=1}^{Q} w_{m,q}|x(n-m)|^{(q-1)} +$$

$$\sum_{l=1}^{L_c}\sum_{m=0}^{M-1} x(n-m)\sum_{q=2}^{Q} w_{m,q,-l}|x(n-m-l)|^{(q-1)} +$$

$$\sum_{l=1}^{L_c}\sum_{m=0}^{M-1}x(n-m)\sum_{q=2}^{Q}w_{m,q,l}|x(n-m+l)|^{(q-1)} + \sum_{l=1}^{L_c}\sum_{m=0}^{M-1}x^*(n-m)\cdot$$

$$\exp(-j2\theta_{m1}+j2\theta_{m2})\cdot\sum_{q=3}^{Q}w_{m,q,-xl}|x(n-m-l)|^{(q-1)} +$$

$$\sum_{l=1}^{L_c}\sum_{m=0}^{M-1}x(n-m)\cdot\exp(-j2\theta_{m1}+j2\theta_{m2})\cdot\sum_{q=3}^{Q}w_{m,q,xl}|x(n-m+l)|^{(q-1)}$$

Where $\exp(-j2\theta_{m1}+j2\theta_{m2})$ represents the vector relationship between the original signal and the conjugated signal of the original signal, and $\theta$ represents the complex angle of the original signal.

Preferably further to the embodiment above of the application, the pre-distortion model in which the conjugated signal is replaced is further transformed into the following equation according to the correspondence relationship between the pre-distortion parameter in the table of pre-distortion parameter indexes, and the signal amplitude of the original signal:

$$z(n) = \sum_{m=0}^{M-1} x(n-m) \cdot \left\{ \begin{array}{l} LUT_m(|x(n-m)|) + \\ \sum_{l=1}^{L_c} LUT_{m-l}(|x(n-m-l)|) + \\ \sum_{l=1}^{L_c} LUT_{m+l}(|x(n-m+l)|) + \\ \sum_{l=1}^{L_c} \exp(-j2\theta_{m1}+j2\theta_{m2})\cdot LUT_{m-xl}(|x(n-m-l)|) + \\ \sum_{l=1}^{L_c} \exp(-j2\theta_{m1}+j2\theta_{m2})\cdot LUT_{m+xl}(|x(n-m+l)|) \end{array} \right.$$

Where LUT represents the table of pre-distortion parameter indexes, and $LUT_m(|x(n-m)|)$ represents the pre-distortion parameter in the LUT table, corresponding to the signal amplitude $|x(n-m)|$ of the original signal.

Preferably further to the embodiment above of the application, the calculator configured to remove the rated linear gain from the first feedback signal to obtain the second feedback signal is configured:

To remove the rated linear gain of the first feedback signal;

To remove the rated linear gain of the conjugated signal of the first feedback signal; and To compose the second feedback signal from the first feedback signal, and the conjugated signal of the first feedback signal, from which the rated linear gain is removed.

Preferably further to the embodiment above of the application, the calculator configured to remove the rated linear gain of the first feedback signal in the equation of:

$$u_{m,q,l_1,t}(n) = \frac{y(n-m)}{G}\left|\frac{y(n-m\mp l)}{G}\right|^q,$$

$$(0 \le l \le L, m = 1 \ldots M, q = 1 \ldots Q),$$

where y represents the first feedback signal, u represents the first feedback signal from which the rated linear gain is removed, G represents the rated linear gain, n represents the instance of time at which the first feedback signal is input, m represents the instance of time at which the first feedback signal is memorized, M represents the memory depth, Q represents the nonlinear order, L represents the maximum numbers of interleaving samples, q represents the nonlinear order index, and l represents the interleaving sample; and The calculator configured to remove the rated linear gain of the conjugated signal of the first feedback signal in the equation of:

$$u^*_{m,q,l_1,t}(n) = \frac{y^*(n-m)}{G}y^2(n-m)\left|\frac{y(n-m\mp l)}{G}\right|^{q-3},$$

$$(0 \le l \le L, m = 1 \ldots M, q = 3 \ldots Q),$$

where y* represents the conjugated signal of the first feedback signal, u* represents the conjugated signal of the first feedback signal, from which the rated linear gain of the power amplifier is removed, G represents the rated linear gain, n represents the instance of time at which the first feedback signal is input, m represents the instance of time at which the first feedback signal is memorized, M represents the memory depth, Q represents the nonlinear order, L represents the maximum numbers of interleaving samples, q represents the nonlinear order index, and l represents the interleaving sample.

Preferably further to the embodiment above of the application, the calculator configured to determine the pre-distortion parameter according to the matrix formed from the second feedback signal, and the matrix formed from the pre-distorted signal is configured:

To substitute the matrix formed from the second feedback signal, and the matrix formed from the pre-distorted signal into the equation of $\hat{w}=(U^H U)^{-1}U^H z$ to determine the least squares solution of the pre-distortion parameter, where $\hat{w}$ represents the least squares solution of the pre-distortion parameter, z represents the matrix formed from the pre-distorted signal, U represents the matrix formed from the second feedback signal, and $U^H$ represents a conjugated matrix of the matrix U; and To determine the pre-distortion parameter according to the least squares solution of the pre-distortion parameter.

Those skilled in the art shall appreciate that the embodiments of the application can be embodied as a method, a system or a computer program product. Therefore the application can be embodied in the form of an all-hardware embodiment, an all-software embodiment or an embodiment of software and hardware in combination. Furthermore the application can be embodied in the form of a computer program product embodied in one or more computer useable storage mediums (including but not limited to a disk memory, a CD-ROM, an optical memory, etc.) in which computer useable program codes are contained.

The application has been described in a flow chart and/or a block diagram of the method, the device (system) and the computer program product according to the embodiments of the application. It shall be appreciated that respective flows and/or blocks in the flow chart and/or the block diagram and combinations of the flows and/or the blocks in the flow chart and/or the block diagram can be embodied in computer program instructions. These computer program instructions can be loaded onto a general-purpose computer, a specific-purpose computer, an embedded processor or a processor of another programmable data processing device to produce a machine so that the instructions executed on the computer or the processor of the other programmable data processing device create means for performing the functions specified in the flow(s) of the flow chart and/or the block(s) of the block diagram.

These computer program instructions can also be stored into a computer readable memory capable of directing the computer or the other programmable data processing device to operate in a specific manner so that the instructions stored in the computer readable memory create an article of manufacture including instruction means which perform the functions specified in the flow(s) of the flow chart and/or the block(s) of the block diagram.

These computer program instructions can also be loaded onto the computer or the other programmable data processing device so that a series of operational steps are performed on the computer or the other programmable data processing device to create a computer implemented process so that the instructions executed on the computer or the other programmable device provide steps for performing the functions specified in the flow(s) of the flow chart and/or the block(s) of the block diagram.

Although the preferred embodiments of the application have been described, those skilled in the art benefiting from the underlying inventive concept can make additional modifications and variations to these embodiments. Therefore the appended claims are intended to be construed as encompassing the preferred embodiments and all the modifications and variations coming into the scope of the application.

Evidently those skilled in the art can make various modifications and variations to the application without departing from the spirit and scope of the application. Thus the application is also intended to encompass these modifications and variations thereto so long as the modifications and variations come into the scope of the claims appended to the application and their equivalents.

The invention claimed is:

1. A method of obtaining a digital pre-distortion parameter, applied in a pre-distortion system, the method comprising:

after a beginning of periodic filtering, obtaining, by a pre-distorter, a pre-distorted signal, and obtaining, by a power amplifier, a power-amplified first feedback signal, wherein the pre-distorted signal is obtained in the following pre-distortion model:

$$z(n) = \sum_{m=0}^{M-1} x(n-m) \sum_{q=1}^{Q} w_{m,q} |x(n-m)|^{(q-1)} +$$

$$\sum_{l=1}^{L_c} \sum_{m=0}^{M-1} x(n-m) \sum_{q=1}^{Q} w_{m,q,-l} |x(n-m-l)|^{(q-1)} +$$

$$\sum_{l=1}^{L_c} \sum_{m=0}^{M-1} x(n-m) \sum_{q=1}^{Q} w_{m,q,l} |x(n-m+l)|^{(q-1)} +$$

$$\sum_{l=1}^{L_c} \sum_{m=0}^{M-1} x^*(n-m) \cdot x^2(n-m-l) \sum_{q=1}^{Q} w_{m,q,-xl} |x(n-m-l)|^{(q-3)} +$$

$$\sum_{l=1}^{L_c} \sum_{m=0}^{M-1} x^*(n-m) \cdot x^2(n-m+l) \sum_{q=1}^{Q} w_{m,q,xl} |x(n-m+l)|^{(q-3)},$$

wherein z(n) represents the pre-distorted signal output at an instance of time n, x(n) represents an original signal input at the instance of time n, n represents the instance of time at which the original signal is input, m represents an instant of time at which the original signal is memorized, w represents a pre-distortion parameter, M represents a memory depth, Q represents a nonlinear order, L represents the maximum number of interleaving samples, q represents a nonlinear order index, * represents conjugation of the signal, l represents an interleaving sample, x(n−m) represents the original signal, and x*(n−m) represents a conjugated signal of the original signal;

removing, by a calculator, a rated linear gain from the power amplified first feedback signal to obtain a second feedback signal;

determining, by the calculator, the pre-distortion parameter according to a matrix formed from the second feedback signal, and a matrix formed from the pre-distorted signal; and updating, by the pre-distorter, a table of pre-distortion parameter indexes using the determined pre-distortion parameter.

2. The method according to claim 1, wherein the conjugated signal of the original signal in the pre-distortion model is replaced with the original signal according to the signal vector relationship between the original signal and the conjugated signal of the original signal, and the pre-distortion model in which the conjugated signal is replaced is as follows:

$$z(n) = \sum_{m=0}^{M-1} x(n-m) \sum_{q=1}^{Q} w_{m,q} |x(n-m)|^{(q-1)} +$$

$$\sum_{l=1}^{L_c} \sum_{m=0}^{M-1} x(n-m) \sum_{q=2}^{Q} w_{m,q,-l} |x(n-m-l)|^{(q-1)} +$$

$$\sum_{l=1}^{L_c} \sum_{m=0}^{M-1} x(n-m) \sum_{q=2}^{Q} w_{m,q,l} |x(n-m+l)|^{(q-1)} + \sum_{l=1}^{L_c} \sum_{m=0}^{M-1} x(n-m) \cdot$$

$$\exp(-j2\theta_{m1} + j2\theta_{m2}) \cdot \sum_{q=3}^{Q} w_{m,q,-xl} |x(n-m-l)|^{(q-1)} +$$

$$\sum_{l=1}^{L_c} \sum_{m=0}^{M-1} x(n-m) \cdot \exp(-j2\theta_{m1} + j2\theta_{m2}) \cdot \sum_{q=3}^{Q} w_{m,q,xl} |x(n-m+l)|^{(q-1)},$$

wherein $\exp(-j2\theta_{m1}+j2\theta_{m2})$ represents the vector relationship between the original signal and the conjugated signal of the original signal, and θ represents the complex angle of the original signal.

3. The method according to claim 2, wherein the pre-distortion model in which the conjugated signal is replaced is further transformed into the following equation according to the correspondence relationship between the pre-distortion parameter in the table of pre-distortion parameter indexes, and the signal amplitude of the original signal:

$$z(n) = \sum_{m=0}^{M-1} x(n-m) \cdot \begin{cases} LUT_m(|x(n-m)|) + \\ \sum_{l=1}^{L_c} LUT_{m-l}(|x(n-m-l)|) + \\ \sum_{l=1}^{L_c} LUT_{m+l}(|x(n-m+l)|) + \\ \sum_{l=1}^{L_c} \exp(-j2\theta_{m1} + j2\theta_{m2}) \cdot LUT_{m-xl}(|x(n-m-l)|) + \\ \sum_{l=1}^{L_c} \exp(-j2\theta_{m1} + j2\theta_{m2}) \cdot LUT_{m+xl}(|x(n-m+l)|) \end{cases},$$

wherein LUT represents the table of pre-distortion parameter indexes, and $LUT_m(|x(n-m)|)$ represents the pre-distortion parameter in the LUT table, corresponding to the signal amplitude $|x(n-m)|$ of the original signal.

4. The method according to claim 3, wherein removing, by the calculator, the rated linear gain from the power amplified first feedback signal to obtain the second feedback signal comprises:
   removing, by the calculator, the rated linear gain of the power amplified first feedback signal;
   removing, by the calculator, the rated linear gain of the conjugated signal of the power amplified first feedback signal; and
   composing, by the calculator, the second feedback signal from the power amplified first feedback signal, and the conjugated signal of the power amplified first feedback signal, from which the rated linear gain is removed.

5. The method according to claim 4, wherein the rated linear gain of the power amplified first feedback signal is removed by the calculator in the equation of:

$$u_{m,q,l_{1,t}}(n) = \frac{y(n-m)}{G}\left|\frac{y(n-mml)}{G}\right|^q,$$

$$(0 \le l \le L, m = 1 \ldots M, q = 1 \ldots Q),$$

wherein y represents the power amplified first feedback signal, u represents the power amplified first feedback signal from which the rated linear gain is removed, G represents the rated linear gain, n represents the instance of time at which the power amplified first feedback signal is input, m represents the instance of time at which the power amplified first feedback signal is memorized, M represents the memory depth, Q represents the nonlinear order, L represents the maximum numbers of interleaving samples, q represents the nonlinear order index, and l represents the interleaving sample; and
   the rated linear gain of the conjugated signal of the power amplified first feedback signal is removed by the calculator in the equation of:

$$u^*_{m,q,l_{1,t}}(n) = \frac{y^*(n-m)}{G} y^2(n-m)\left|\frac{y(n-mml)}{G}\right|^{q-3},$$

$$(0 \le l \le L, m = 1 \ldots M, q = 3 \ldots Q),$$

wherein y* represents the conjugated signal of the power amplified first feedback signal, u* represents the conjugated signal of the power amplified first feedback signal, from which the rated linear gain of the power amplifier is removed, G represents the rated linear gain, n represents the instance of time at which the power amplified first feedback signal is input, m represents the instance of time at which the first feedback signal is memorized, M represents the memory depth, Q represents the nonlinear order, L represents the maximum numbers of interleaving samples, q represents the nonlinear order index, and l represents the interleaving sample.

6. The method according to claim 1, wherein determining, by the calculator, the pre-distortion parameter according to the matrix formed from the second feedback signal, and the matrix formed from the pre-distorted signal comprises:
   substituting the matrix formed from the second feedback signal, and the matrix formed from the pre-distorted signal into the equation of $\hat{w}=(U^H U)^{-1} U^H z$ to determine least squares solution of the pre-distortion parameter, wherein $\hat{w}$ represents the least squares solution of the pre-distortion parameter, z represents the matrix formed from the pre-distorted signal, U represents the matrix formed from the second feedback signal, and $U^H$ represents a conjugated matrix of the matrix U; and
   determining, by the calculator, the pre-distortion parameter according to the least squares solution of the pre-distortion parameter.

7. A digital pre-distorting system, comprising:
   a pre-distorter configured after periodical filtering to pre-distort an original input signal, and to output the pre-distorted signal to a power amplifier; and to update a table of pre-distortion parameter indexes using a pre-distortion parameter transmitted by a calculator, wherein the pre-distorted signal is obtained in the following pre-distortion model:

$$z(n) = \sum_{m=0}^{M-1} x(n-m)\sum_{q=1}^{Q} w_{m,q}|x(n-m)|^{(q-1)} +$$

$$\sum_{l=1}^{L_c}\sum_{m=0}^{M-1} x(n-m)\sum_{q=1}^{Q} w_{m,q,-l}|x(n-m-l)|^{(q-1)} +$$

$$\sum_{l=1}^{L_c}\sum_{m=0}^{M-1} x(n-m)\sum_{q=1}^{Q} w_{m,q,l}|x(n-m+l)|^{(q-1)} +$$

$$\sum_{l=1}^{L_c}\sum_{m=0}^{M-1} x^*(n-m)\cdot x^2(n-m-l)\sum_{q=1}^{Q} w_{m,q,-xl}|x(n-m-l)|^{(q-3)} +$$

$$\sum_{l=1}^{L_c}\sum_{m=0}^{M-1} x^*(n-m)\cdot x^2(n-m+l)\sum_{q=1}^{Q} w_{m,q,xl}|x(n-m+l)|^{(q-3)},$$

wherein z(n) represents the pre-distorted signal output at an instance of time n, x(n) represents the original signal input at the instance of time n, n represents the instance of time at which the original signal is input, m represents an instant of time at which the original signal is memorized, w represents the pre-distortion parameter, M represents a memory depth, Q represents a nonlinear order, L represents the maximum number of interleaving samples, q represents a nonlinear order index, * represents conjugation of the signal, l represents an interleaving sample, x(n−m) represents the original input signal, and x*(n−m) represents a conjugated signal of the original input signal; and the power amplifier configured to amplify power of the pre-distorted signal output by the pre-distorter, and to output a first feedback signal to the calculator; and the calculator configured to obtain the pre-distorted signal and the first feedback signal, and to remove a rated linear gain from the first feedback signal to obtain a second feedback signal; and to determine the pre-distortion parameter according to a matrix formed from the second feedback signal, and a matrix formed from the pre-distorted signal; and to transmit the determined pre-distortion parameter to the pre-distorter.

8. The system according to claim 7, wherein the conjugated signal of the original input signal in the pre-distortion model is replaced with the original input signal according to a signal vector relationship between the original input signal and the conjugated signal of the original signal, and the pre-distortion model in which the conjugated signal is replaced is as follows:

$$z(n) = \sum_{m=0}^{M-1} x(n-m) \sum_{q=1}^{Q} w_{m,q} |x(n-m)|^{(q-1)} +$$

$$\sum_{l=1}^{L_c} \sum_{m=0}^{M-1} x(n-m) \sum_{q=2}^{Q} w_{m,q,-l} |x(n-m-l)|^{(q-1)} +$$

$$\sum_{l=1}^{L_c} \sum_{m=0}^{M-1} x(n-m) \sum_{q=2}^{Q} w_{m,q,l} |x(n-m+l)|^{(q-1)} + \sum_{l=1}^{L_c} \sum_{m=0}^{M-1} x(n-m) \cdot$$

$$\exp(-j2\theta_{m1} + j2\theta_{m2}) \cdot \sum_{q=3}^{Q} w_{m,q,-xl} |x(n-m-l)|^{(q-1)} +$$

$$\sum_{l=1}^{L_c} \sum_{m=0}^{M-1} x(n-m) \cdot \exp(-j2\theta_{m1} + j2\theta_{m2}) \cdot \sum_{q=3}^{Q} w_{m,q,xl} |x(n-m+l)|^{(q-1)},$$

wherein $\exp(-j2\theta_{m1}+j2\theta_{m2})$ represents the vector relationship between the original signal and the conjugated signal of the original input signal, and θ represents the complex angle of the original signal.

9. The system according to claim 8, wherein the pre-distortion model in which the conjugated signal is replaced is further transformed into the following equation according to the correspondence relationship between the pre-distortion parameter in the table of pre-distortion parameter indexes, and the signal amplitude of the original input signal:

$$z(n) = \sum_{m=0}^{M-1} x(n-m) \cdot \left\{ \begin{array}{l} LUT_m(|x(n-m)|) + \\ \sum_{l=1}^{L_c} LUT_{m-l}(|x(n-m-l)|) + \\ \sum_{l=1}^{L_c} LUT_{m+l}(|x(n-m+l)|) + \\ \sum_{l=1}^{L_c} \exp(-j2\theta_{m1} + j2\theta_{m2}) \cdot LUT_{m-xl}(|x(n-m-l)|) + \\ \sum_{l=1}^{L_c} \exp(-j2\theta_{m1} + j2\theta_{m2}) \cdot LUT_{m+xl}(|x(n-m+l)|) \end{array} \right\},$$

wherein LUT represents the table of pre-distortion parameter indexes, and $LUT_m(|x(n-m)|)$ represents the pre-distortion parameter in the LUT table, corresponding to the signal amplitude $|x(n-m)|$ of the original input signal.

10. The system according to claim 9, wherein the calculator configured to remove the rated linear gain from the first feedback signal to obtain the second feedback signal is configured:

to remove the rated linear gain of the first feedback signal;

to remove the rated linear gain of the conjugated signal of the first feedback signal; and to compose the second feedback signal from the first feedback signal, and the conjugated signal of the first feedback signal, from which the rated linear gain is removed.

11. The system according to claim 10, wherein the calculator configured to remove the rated linear gain of the first feedback signal in the equation of $$u_{m,q,l_{1,t}}(n) = \frac{y(n-m)}{G} \left| \frac{y(n-mml)}{G} \right|^q,$$

$$(0 \leq l \leq L, m = 1 \ldots M, q = 1 \ldots Q),$$

wherein y represents the first feedback signal, u represents the first feedback signal from which the rated linear gain is removed, G represents the rated linear gain, n represents the instance of time at which the first feedback signal is input, m represents the instance of time at which the first feedback signal is memorized, M represents the memory depth, Q represents the nonlinear order, L represents the maximum numbers of interleaving samples, q represents the nonlinear order index, and l represents the interleaving sample; and the calculator configured to remove the rated linear gain of the conjugated signal of the first feedback signal in the equation of:

$$u^*_{m,q,l_{1,t}}(n) = \frac{y^*(n-m)}{G} y^2(n-m) \left| \frac{y(n-mml)}{G} \right|^{q-3},$$

$$(0 \leq l \leq L, m = 1 \ldots M, q = 3 \ldots Q),$$

wherein y* represents the conjugated signal of the first feedback signal, u* represents the conjugated signal of the first feedback signal, from which the rated linear gain of the power amplifier is removed, G represents the rated linear gain, n represents the instance of time at which the first feedback signal is input, m represents the instance of time at which the first feedback signal is memorized, M represents the memory depth, Q represents the nonlinear order, L represents the maximum numbers of interleaving samples, q represents the nonlinear order index, and l represents the interleaving sample.

12. The system according to claim 7, wherein the calculator configured to determine the pre-distortion parameter according to the matrix formed from the second feedback signal, and the matrix formed from the pre-distorted signal is configured:
   to substitute the matrix formed from the second feedback signal, and the matrix formed from the pre-distorted signal into the equation of $\hat{w}=(U^H U)^{-1} U^H z$ to determine least squares solution of the pre-distortion parameter, wherein $\hat{w}$ represents the least squares solution of the pre-distortion parameter, z represents the matrix formed from the pre-distorted signal, U represents the matrix formed from the second feedback signal, and $U^H$ represents a conjugated matrix of the matrix U; and
   to determine the pre-distortion parameter according to the least squares solution of the pre-distortion parameter.

* * * * *